(12) United States Patent
Conner

(10) Patent No.: US 6,183,811 B1
(45) Date of Patent: *Feb. 6, 2001

(54) METHOD OF REPAIRING TURBINE AIRFOILS

(75) Inventor: Jeffrey A. Conner, Hamilton, OH (US)

(73) Assignee: General Electric Company, Cincinnati, OH (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/210,888

(22) Filed: Dec. 15, 1998

(51) Int. Cl.⁷ ........................................... C23C 16/12
(52) U.S. Cl. ........................ 427/250; 427/253; 427/142
(58) Field of Search ................... 427/252, 140, 427/142, 250, 253; 216/37, 58, 83

(56) References Cited

U.S. PATENT DOCUMENTS

| | | | |
|---|---|---|---|
| 4,141,127 | * 2/1979 | Cretella et al. | 29/889.1 |
| 4,402,992 | * 9/1983 | Liebert | 427/456 |
| 4,743,462 | * 5/1988 | Radzavich et al. | 427/448 |
| 5,221,354 | 6/1993 | Rigney . | |
| 5,441,767 | * 8/1995 | DeSaulniers | 427/252 |
| 5,695,659 | * 12/1997 | Dickie | 216/48 |
| 5,723,078 | * 3/1998 | Nagaraj et al. | 264/36.18 |
| 5,780,106 | * 7/1998 | Conner | 427/252 |
| 5,928,725 | * 7/1999 | Howard et al. | 427/237 |
| 5,985,122 | * 11/1999 | Conner | 427/282 |

FOREIGN PATENT DOCUMENTS

99/23273    5/1999   (WO) .

* cited by examiner

Primary Examiner—Shrive Beck
Assistant Examiner—Bret Chen
(74) Attorney, Agent, or Firm—Andrew C. Hess; Gerry S. Gressel

(57) ABSTRACT

A method for preventing the aluminizing of cooling holes and internal surfaces of an airfoil during vapor phase aluminizing. The method generally entails flowing a gas through internal cavities of the airfoil and out through the cooling holes, while the surfaces of the airfoil are aluminized by vapor phase deposition. As a result of the outward gas flow, volatile activators and aluminum compounds are prevented from flowing into the cooling holes and internal cavity, thereby preventing aluminizing of the cooling hole walls and internal surfaces of the airfoil and interactions with any oxide deposits on the surfaces of the cooling holes and internal cavities.

9 Claims, 1 Drawing Sheet

METHOD OF REPAIRING TURBINE AIRFOILS

FIELD OF THE INVENTION

The present invention relates to methods for forming environmental coatings on turbine airfoils. More particularly, this invention relates to a method of preventing oxide interactions and the deposition of excess coating material within cooling holes and on internal cavity surfaces of an airfoil during aluminizing by vapor phase deposition.

BACKGROUND OF THE INVENTION

Airfoils of turbine blades and vanes of gas turbine engines often require a complex cooling scheme in which cooling air flows through the airfoil and is then discharged through carefully configured cooling holes, for example, cooling slots at the trailing edge of the airfoil. The performance of a turbine airfoil is directly related to the ability to provide uniform cooling of its external surfaces. Consequently, the control of cooling hole size and shape is critical in many turbine airfoil designs because the size and shape of the opening determine the amount of flow exiting a given opening, its distribution across the surface of the component, and the overall flow distribution within the cooling circuit that contains the opening. Other factors, such as backflow margin (the pressure delta between cooling air exiting the cooling holes and combustion gas impinging on the airfoil) are also affected by variations in opening size. In addition to conventional hole drilling techniques such as laser machining and electrical-discharge machining (EDM), complex advanced casting practices are typically used to yield airfoil castings with dimensionally correct openings in order to repeatably control opening size. Once cast, subsequent airfoil manufacturing operations must be performed such that cast-to-size openings are not processed through any operations that would significantly alter the dimensions of some or all of the openings.

Due to the severity of the operating environment of turbine airfoils, environmentally protective coatings are typically applied to these components when manufactured, and must be removed and reapplied during their repair. Diffusion aluminides and MCrAlY coatings overcoated with a diffused aluminide coating are widely used in the gas turbine engine industry as environmental coatings for airfoils. These coatings are produced by aluminizing the airfoil surfaces by such known methods as pack cementation, above-pack, chemical vapor deposition, slurry coating, and vapor (gas) phase deposition techniques. Each of these processes generally entails reacting the surfaces of the airfoil with an aluminum-containing composition to form two distinct zones, an outermost of which is an additive layer that contains the environmentally-resistant intermetallic phase MAl, where M is iron, nickel or cobalt, depending on the substrate material (e.g., mainly β(NiAl) if the substrate is Ni-base). The chemistry of the additive layer can be altered with such as elements as chromium, silicon, platinum, palladium, rhodium, hafnium, yttrium and zirconium in order to modify the environmental properties of the coating. Beneath the additive layer is a diffusion zone comprised of various intermetallic and metastable phases that form during the coating reaction as a result of diffusional gradients and changes in elemental solubility in the local region of the substrate. Diffusion zones in aluminide coatings on nickel-base superalloys typically include NiAl and secondary phases such as dispersed metallic phases (e.g., Cr, W), carbides (e.g., TaC) and sigma phases (e.g., CoCr), and a region of γ—γ structure that is locally depleted of solid solution strengthening elements.

As is apparent from the concerns discussed above regarding cooling hole dimensions, diffusion aluminide coatings must not prevent the airfoil from meeting numerous operational requirements, including airflow requirements for the cooling air required to flow through the internal cavities of the airfoil and exit through cooling holes and slots at the airfoil surface. As a result, cooling holes of new airfoils must be formed in an oversize condition in anticipation of the aluminide coating, or care must be taken to avoid or minimize aluminizing of the cooling holes. Likewise, aluminizing of airfoils returned for repair must also be performed with care to avoid or minimize aluminizing of the cooling holes and internal surfaces of the airfoils. Airfoils undergoing repair create additional process concerns, since the removal of a preexisting environmental coating and the subsequent application of a new coating can alter cooling hole dimensions. A typical approach for removing an existing aluminide coating is a combination of chemical stripping and grit blasting, which remove both the additive layer and the diffusion zone of the coating. To minimize impact on airflow control, internal surfaces and cooling holes, whether originally coated or intentionally left bare, are often masked, e.g., filled with wax, prior to coating removal in order to prevent removal of the aluminide coating from the walls of the cooling holes and internal surfaces. Such steps also prevent interaction of the stripping solution with oxides deposited within the cooling holes and on internal surfaces during engine operation. Otherwise, reactions between stripping solutions and oxide deposits can result in the liberation of oxide flakes that can plug cooling holes during subsequent engine operation, and/or result in entrapment of residual stripping solution in oxide scales, leading to rapid attack of airfoil internal surfaces when the blade is heated to elevated temperatures.

The preferred method for applying diffusion aluminide environmental coatings in the gas turbine industry has been by vapor phase deposition. Compared to pack cementation, vapor phase deposition produces a better surface finish, avoids hole plugging associated with pack powder, reduces heat-up and cool-down times during processing by eliminating a significant amount of the thermal mass, and improves coating cleanliness. Vapor phase processes include the use of "activators" such as fluorides, chlorides and bromides as part of the coating generation process. These activators are vaporized during vapor phase aluminizing, and freely travel through airfoil cooling holes and into airfoil internal cavities where, if the component being repaired has seen engine service, interactions occur with the oxide deposits and any aluminide coating remaining in the cooling holes and/or internal surfaces. These interactions are detrimental, leading to the reduction of oxides formed during engine operation and/or the deposition of new coating over existing coating and/or oxides. Coating deposited on top of an existing internal coating and/or internal surfaces that have an oxide scale previously formed during engine operation does not adhere well and can flake off during subsequent engine operation, leading to plugging of cooling holes and loss of cooling airflow control. Additionally, deposition of coating on internal surfaces can change pressure drops associated with movement of cooling air through complex internal passages of airfoils, leading to the deterioration of backflow margin. Masking solutions that can be employed during stripping of existing aluminide coatings are not appropriate during vapor phase aluminizing due to the elevated processing temperatures sustained.

In view of the above, it would be desirable if an improved method were available for protecting airfoil cooling holes and other internal surfaces during vapor phase deposition of a diffusion aluminide coating.

SUMMARY OF THE INVENTION

According to the present invention, a method is provided for preventing the aluminizing of cooling holes and other internal surfaces of an airfoil by vapor phase deposition. The method of this invention also prevents other undesired interactions between coating gases and cooling hole surfaces and/or other internal surfaces, such as reactions with existing oxides present from engine operation of the component being coated. The method generally entails flowing a gas through the internal cavities of the airfoil and out through the cooling holes to the exterior of the airfoil. While the flow of gas is maintained, the surfaces of the airfoil are aluminized by vapor phase deposition. As a result of the outward gas flow, volatile activators and aluminum compounds are prevented from flowing into the cooling holes, thereby preventing aluminizing of the cooling hole walls and internal surfaces, and preventing interactions with any oxide deposits within the cooling holes and on the internal surfaces of the airfoil. According to the invention, the process is useful for the repair of airfoils as well as newly manufactured airfoils by preventing the buildup of aluminide and other materials on the walls of the cooling holes and other internal airfoil surfaces that could act as flow restrictors and adversely impact airflow and flow distribution through the airfoil.

From the above, it can be seen that a notable advantage of the present invention is that it succeeds in maintaining required cooling hole dimensions and internal cavity conditions for a blade that undergoes vapor phase aluminizing, yet is uncomplicated in its processing and equipment requirements. In addition, the invention makes use of commercially available gases to protect internal surfaces of an airfoil from reactions and material buildup, without interfering with the desired coating reactions. The only limitation is that the gases must be non-reactive to aluminum, the airfoil substrate and the coating gases present during vapor phase aluminizing, and must be flowed at levels that will not interfere with the aluminizing of surfaces surrounding the cooling holes.

Other objects and advantages of this invention will be better appreciated from the following detailed description.

DETAILED DESCRIPTION OF THE INVENTION

Figure 1:
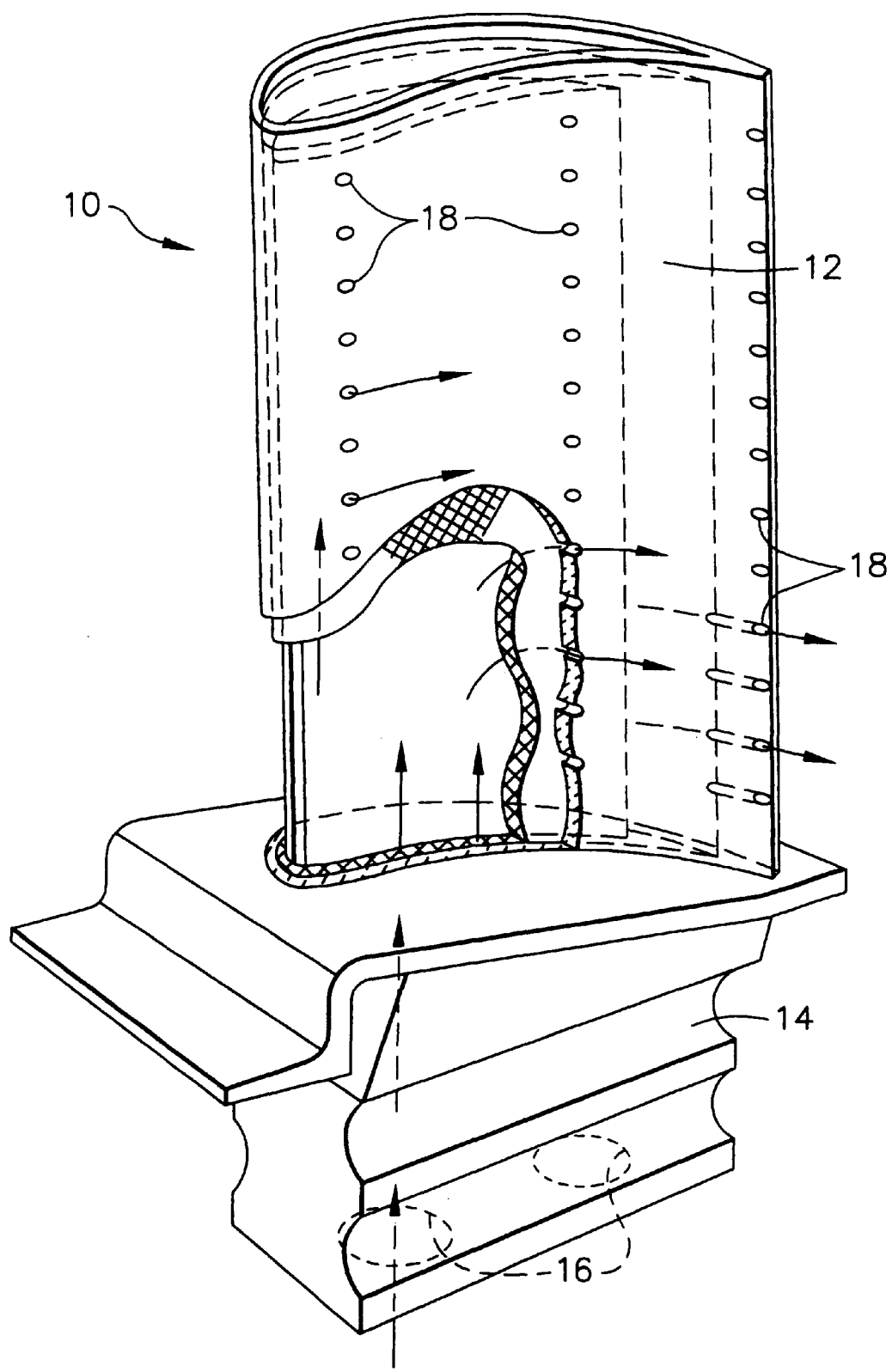
FIG. 1 is of a turbine airfoil having surface cooling holes.

The present invention provides a method for preventing oxide interactions and the deposition of excess coating material within surface openings and internal cavities of an article during aluminizing of the article by vapor phase deposition. The method will be described in reference to a gas turbine engine turbine blade 10 represented in FIG. 1. While the advantages of this invention will be described with reference to the blade 10, the teachings of this invention are generally applicable to any component having surface openings and on which an aluminide coating is to be deposited with the exception of the walls of the surface openings and internal cavities.

As is generally conventional, the blade 10 shown in FIG. 1 may be formed of an iron, nickel or cobalt-base superalloy. The blade 10 includes an airfoil section 12 against which hot combustion gases are directed during operation of the gas turbine engine, and whose surfaces are therefore subjected to severe attack by oxidation, corrosion and erosion. The airfoil section 12 is anchored to a turbine disk (not shown) through a root section 14. Cooling passages 16 visible in the root section 14 extend through the airfoil section 12, defining internal cavities that terminate at a number of cooling holes 18. Bleed air is forced through the cooling passages 16 and cavities, and is then discharged from the cooling holes 18 in order to transfer heat from the blade 10 and film cool the surrounding surfaces of the airfoil 12. While a particular cooling hole and cavity configuration is represented in FIG. 1, the invention is applicable to other hole configurations and cooling schemes.

According to this invention, the airfoil section 12 is or is intended to be protected from the hostile environment of the turbine section by an environmentally-resistant aluminide coating. As is understood in the art, aluminide coatings may incorporate a variety of additional elements to modify the environmental and physical properties of the resulting coating. Aluminide coatings of interest are those deposited by vapor (gas) phase deposition.

The invention is applicable to a new blade that is to undergo aluminizing for the first time, as well as a blade that has seen engine service and whose environmental aluminide coating must be removed before it can be repaired, after which an aluminide coating is reapplied before returning the blade to service. Whether or not the blade 10 has seen service, an aluminide coating deposited in accordance with this invention is not deposited within the cooling holes 18 or internal cavities of the blade 10, but instead is limited to the exterior surfaces of the airfoil 12. If the blade 10 has seen service, residual oxide deposits will inevitably be present on the walls of the cooling holes 18 and internal cavities as a result of extreme temperatures and contaminants present in the engine operating environment. Vapor phase aluminizing of the blade 10 without protection of the cooling holes 18 and internal cavities would result in the deposition of additional aluminide and undesirable interactions between the coating gases and the residual oxides, both of which would significantly alter the dimensions of the cooling holes 18 and the condition of the internal surfaces of the blade 10, and therefore adversely impact airflow and flow distribution through the airfoil 12.

Therefore, to obtain the advantages of vapor phase aluminizing while simultaneously preventing the adverse effects that result if the coating gases are allowed to enter the cooling holes 18, one or more non-reactive gases are continuously flowed through the cooling passages 16 within the airfoil 12 and out through the cooling holes 18 during the aluminizing process. The particular gases used should be carefully selected to ensure that the desired coating reaction on the exterior surfaces of the airfoil 12 are not impeded. For this reason, gases such as argon and hydrogen are preferred for this invention, though it is foreseeable that other non-reactive gases could be used. Control of the gas pressure is also important to the success of this invention, in that excess flow rates can dilute the coating gases and inhibit coating of the airfoil 12 immediately surrounding the cooling holes 18. Therefore, appropriate pressures must be determined experimentally based the number and type of airfoils to be treated, and the particular coating chamber used.

When the method of this invention is employed in the repair of the blade 10, the existing environmental coating (an aluminide or another protective coating) is removed from the surface of the airfoil 12, with any portion of the coating within the cooling holes 18 and internal cavities of the blade 10 being permitted to remain in accordance with known practices. Thereafter, during aluminizing, flow of the gas through the airfoil 12 in the manner described above prevents additional aluminizing of the existing environmental coating within the cooling holes 18 and internal cavities, and also prevents reactions between the coating gases and oxide deposits that are present on the surfaces of the cooling holes 18 and internal cavities as a result of in-service oxidation and contamination of the blade 10. If the method is part of a manufacturing process for a new blade, flowing gases through the airfoil 12 in the manner described above prevents aluminizing of the cooling hole and internal cavity walls, such that these surfaces are free of aluminide coating following aluminizing.

While the invention has been described in terms of a preferred embodiment, it is apparent that other forms could be adopted by one skilled in the art. For example, the physical configuration of the blade 10, cooling passages 16 and cooling holes 18 could vary from that shown. In addition, the method of this invention could also be applied to other components, including gas turbine engine shrouds and combustor centerbodies having gas manifolds. Therefore, the scope of the invention is to be limited only by the following claims.

What is claimed is:

1. A method for repairing a gas turbine engine component, the method comprising the steps of:

providing a gas turbine engine component having an internal cavity and having a cooling hole in a surface thereof, the internal cavity and the cooling hole having oxide deposits on surfaces thereof;

preventing reactions with the oxide deposits while vapor phase aluminizing the surface of the component by flowing a gas through the internal cavity and out through the cooling hole of the component, the gas flowing through the internal cavity and the cooling hole further preventing aluminizing of the surfaces of the internal cavity and the cooling hole without interfering with the aluminizing of the surface of the component immediately surrounding the cooling hole.

2. A method as recited in claim 1, wherein the gas is selected from the group consisting of argon, hydrogen, and combinations thereof.

3. A method as recited in claim 1, the method further comprising the step of removing an environmental coating from the surface of the component prior to the aluminizing step, the environmental coating being chosen from the group consisting of diffusion aluminides and MCrAlY coatings overcoated with a diffused aluminide coating.

4. A method as recited in claim 3, wherein a portion of the environmental coating remains on the surfaces of the cooling hole and the internal cavity after the removing step, the gas preventing aluminizing of the environmental coating during the aluminizing step.

5. A method as recited in claim 1, wherein the component is an airfoil.

6. A method of repairing an airfoil having an internal cavity, cooling holes in a surface thereof, and oxide deposits on surfaces of the internal cavity and the cooling hole, the method comprising the steps of:

removing an environmental coating from the surface of the airfoil, the environmental coating being chosen from the group consisting of diffusion aluminides and MCrAlY coatings overcoated with a diffused aluminide coating; and preventing reactions with the oxide deposits while vapor phase aluminizing the surface of the airfoil by flowing a gas through the internal cavity and out through the cooling holes of the airfoil, the gas flowing through the internal cavity and the cooling hole further preventing aluminizing of the surfaces of the internal cavity and the cooling holes without interfering with the aluminizing of the surface of the airfoil immediately surrounding the cooling holes.

7. A method as recited in claim 6, wherein the gas is selected from the group consisting of argon, hydrogen, and combinations thereof.

8. A method as recited in claim 6, wherein a portion of the environmental coating remains on the surfaces of the internal cavity and the cooling holes after the removing step, the gas preventing aluminizing of the environmental coating during the aluminizing step.

9. A method as recited in claim 6, wherein the gas is flowed at a level that does not interfere with the aluminizing of surfaces of the airfoil immediately surrounding the cooling holes.

* * * * *